(12) United States Patent
Yang et al.

(10) Patent No.: US 10,192,611 B1
(45) Date of Patent: Jan. 29, 2019

(54) SENSING CIRCUIT, SET OF PRE-AMPLIFIERS, AND OPERATING METHOD THEREOF

(71) Applicant: NATIONAL TSING HUA UNIVERSITY, Hsinchu (TW)

(72) Inventors: Tzu-Hsien Yang, New Taipei (TW); Meng-Fan Chang, Taichung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/695,029

(22) Filed: Sep. 5, 2017

(51) Int. Cl.
| | | |
|---|---|---|
| G11C 29/00 | (2006.01) | |
| G11C 11/4091 | (2006.01) | |
| G11C 11/408 | (2006.01) | |
| G11C 11/4096 | (2006.01) | |
| H02M 1/08 | (2006.01) | |
| G11C 11/56 | (2006.01) | |
| G11C 11/24 | (2006.01) | |
| G11C 11/4099 | (2006.01) | |

(52) U.S. Cl.
CPC .......... *G11C 11/4091* (2013.01); *G11C 11/24* (2013.01); *G11C 11/4087* (2013.01); *G11C 11/4096* (2013.01); *G11C 11/4099* (2013.01); *G11C 11/5642* (2013.01); *H02M 1/082* (2013.01)

(58) Field of Classification Search
CPC . G11C 11/4091; G11C 11/4099; G11C 11/24; G11C 11/5642; G11C 11/4096; G11C 11/4087; H02M 1/082
USPC ........................................................ 365/205
See application file for complete search history.

(56) References Cited

U.S. PATENT DOCUMENTS 4,379,345 A * 4/1983 Url ...................... G11C 11/4091
327/55

\* cited by examiner

*Primary Examiner* — Tha-O H Bui
(74) *Attorney, Agent, or Firm* — CKC & Partners Co., Ltd.

(57) ABSTRACT

The present provides a sensing circuit, a set of pre-amplifiers, and an operating method thereof. The set of pre-amplifiers includes a first pre-amplifier and a second pre-amplifier. The first pre-amplifier is coupled to a first input terminal of the sense amplifier. The second pre-amplifier is coupled to a second input terminal of the sense amplifier. The first pre-amplifier and the second pre-amplifier respectively performs a discharging operation to discharge the first input terminal and the second input terminal of the sense amplifier after the first input terminal and the second input terminal of the sense amplifier are charged to a predetermined voltage. One of the first pre-amplifier and the second pre-amplifier amplifies a voltage difference between the first input terminal and the second input terminal of the sense amplifier by terminating the discharging operation of another of the first pre-amplifier and the second pre-amplifier.

11 Claims, 8 Drawing Sheets respectively performing a discharging operation to discharge the first input terminal and the second input terminal of the sense amplifier after the first input terminal and the second input terminal of the sense amplifier are charged to a predetermined voltage ⎯ S310

amplifying a voltage difference between the first input terminal and the second input terminal of the sense amplifier by terminating the discharging operation of another of the first pre-amplifier and the second pre-amplifier ⎯ S320

Fig. 3

SENSING CIRCUIT, SET OF PRE-AMPLIFIERS, AND OPERATING METHOD THEREOF

BACKGROUND

Technical Field

The present disclosure relates to a sensing circuit, a set of pre-amplifiers, and an operating method thereof. More particularly, the present disclosure relates to a sensing circuit, a set of pre-amplifiers, and an operating method that is capable of amplifying the voltage difference between a first input terminal and a second input terminal of a sense amplifier of the sensing circuit.

Description of Related Art

A sense amplifier is part of the sensing circuit that is used for reading data from a memory device. The role of the sense amplifier is to sense the low power signals from a bit line that represents a data bit (1 or 0) stored in a memory cell of the memory device, and amplify the small voltage swing to recognizable logic levels so the data can be interpreted properly by logic outside the memory device. There is one sense amplifier for each column of memory cells, and hence a memory device may be disposed with numerous sense amplifiers based on the number of columns.

Sense amplifiers are applied in memory cells which are laid out in rows and columns on the chip. Each line is attached to each cell in the row. The lines which run along the rows are called word lines which are activated by putting a voltage on it. The lines which run along the columns are called bit lines, and two such complementary bit lines are attached to a sense amplifier at the edge of the array.

Conventionally, when the memory cell is light-loaded or has smaller resistance (e.g., MRAM or RRAM), the sensing yield of the sense amplifier will be low if the voltage difference between the two complementary bit lines is too small. Therefore, it is crucial to develop a mechanism to amplify the voltage difference between the two complementary bit lines for improving the sensing yield.

SUMMARY

The present disclosure provides a set of pre-amplifiers of a sense amplifier. The set of pre-amplifiers includes a first pre-amplifier and a second pre-amplifier. The first pre-amplifier is coupled to a first input terminal of the sense amplifier. The second pre-amplifier is coupled to a second input terminal of the sense amplifier. The first pre-amplifier and the second pre-amplifier respectively performs a discharging operation to discharge the first input terminal and the second input terminal of the sense amplifier after the first input terminal and the second input terminal of the sense amplifier are charged to a predetermined voltage. One of the first pre-amplifier and the second pre-amplifier amplifies a voltage difference between the first input terminal and the second input terminal of the sense amplifier by terminating the discharging operation of another of the first pre-amplifier and the second pre-amplifier.

The present disclosure provides a sensing circuit for sensing data of a memory cell. The sensing circuit includes a sense amplifier and a set of pre-amplifiers. The sense amplifier has a first input terminal and a second input terminal. The set of pre-amplifiers includes a first pre-amplifier and a second pre-amplifier. The first pre-amplifier is coupled to the first input terminal of the sense amplifier. The second pre-amplifier is coupled to the second input terminal of the sense amplifier. The first pre-amplifier and the second pre-amplifier respectively performs a discharging operation to discharge the first input terminal and the second input terminal of the sense amplifier after the first input terminal and the second input terminal of the sense amplifier are charged to a predetermined voltage. One of the first pre-amplifier and the second pre-amplifier amplifies a voltage difference between the first input terminal and the second input terminal of the sense amplifier by terminating the discharging operation of another of the first pre-amplifier and the second pre-amplifier. The sense amplifier performs a sensing operation to sense the data of the memory cell based on the amplified voltage difference between the first input terminal and the second input terminal.

The present disclosure proposes an operating method of a set of pre-amplifiers having a first pre-amplifier and a second pre-amplifier respectively coupled to a first input terminal and a second input terminal of a sense amplifier. The operating method includes the following steps: respectively performing, by the first pre-amplifier and the second pre-amplifier, a discharging operation to discharge the first input terminal and the second input terminal of the sense amplifier after the first input terminal and the second input terminal of the sense amplifier are charged to a predetermined voltage; and amplifying, by one of the first pre-amplifier and the second pre-amplifier, a voltage difference between the first input terminal and the second input terminal of the sense amplifier by terminating the discharging operation of another of the first pre-amplifier and the second pre-amplifier.

BRIEF DESCRIPTION OF THE DRAWINGS

The present disclosure can be more fully understood by reading the following detailed description of the embodiment, with reference made to the accompanying drawings as follows:

FIG. 3 shows a flow chart of a method of operating the set of pre-amplifiers according to an exemplary embodiment of the present disclosure;

DETAILED DESCRIPTION

Figure 1A:
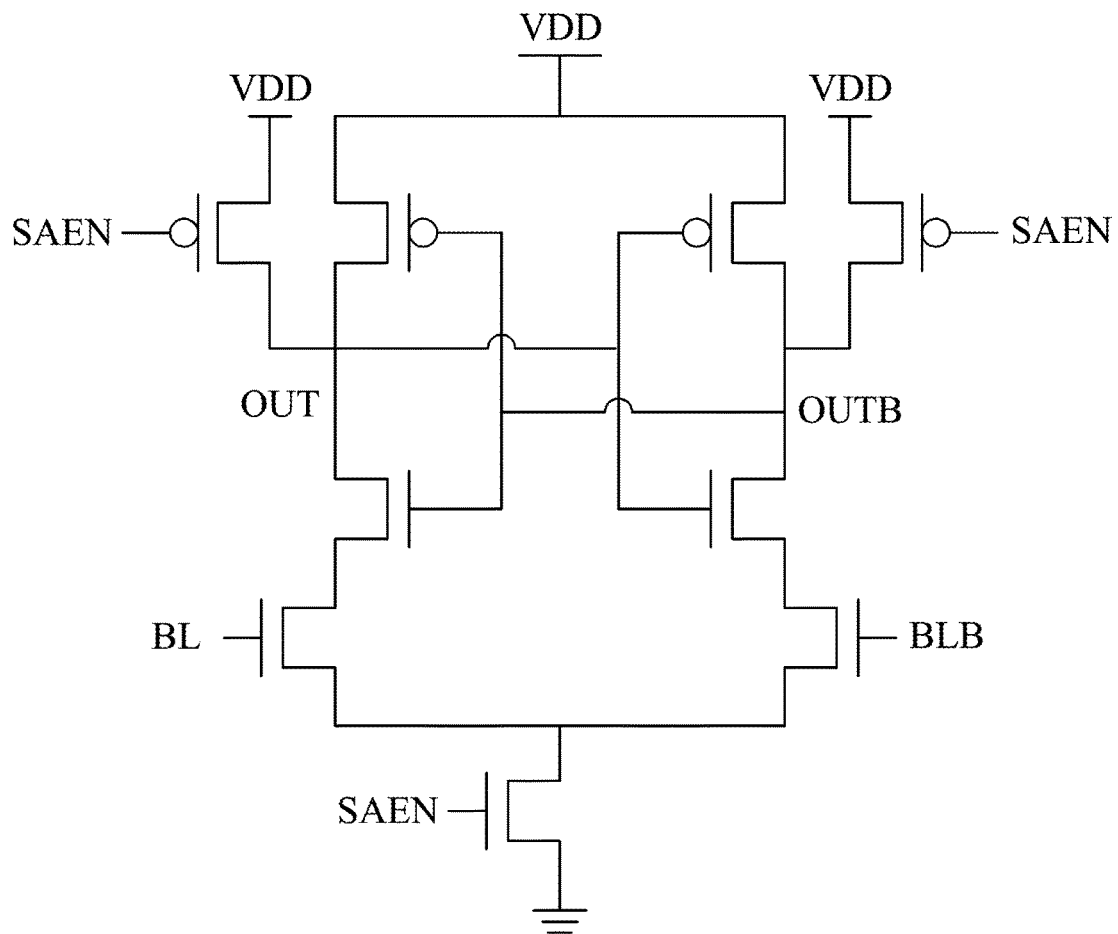
FIG. 1A is a schematic diagram illustrating a sense amplifier.
Figure 1B:
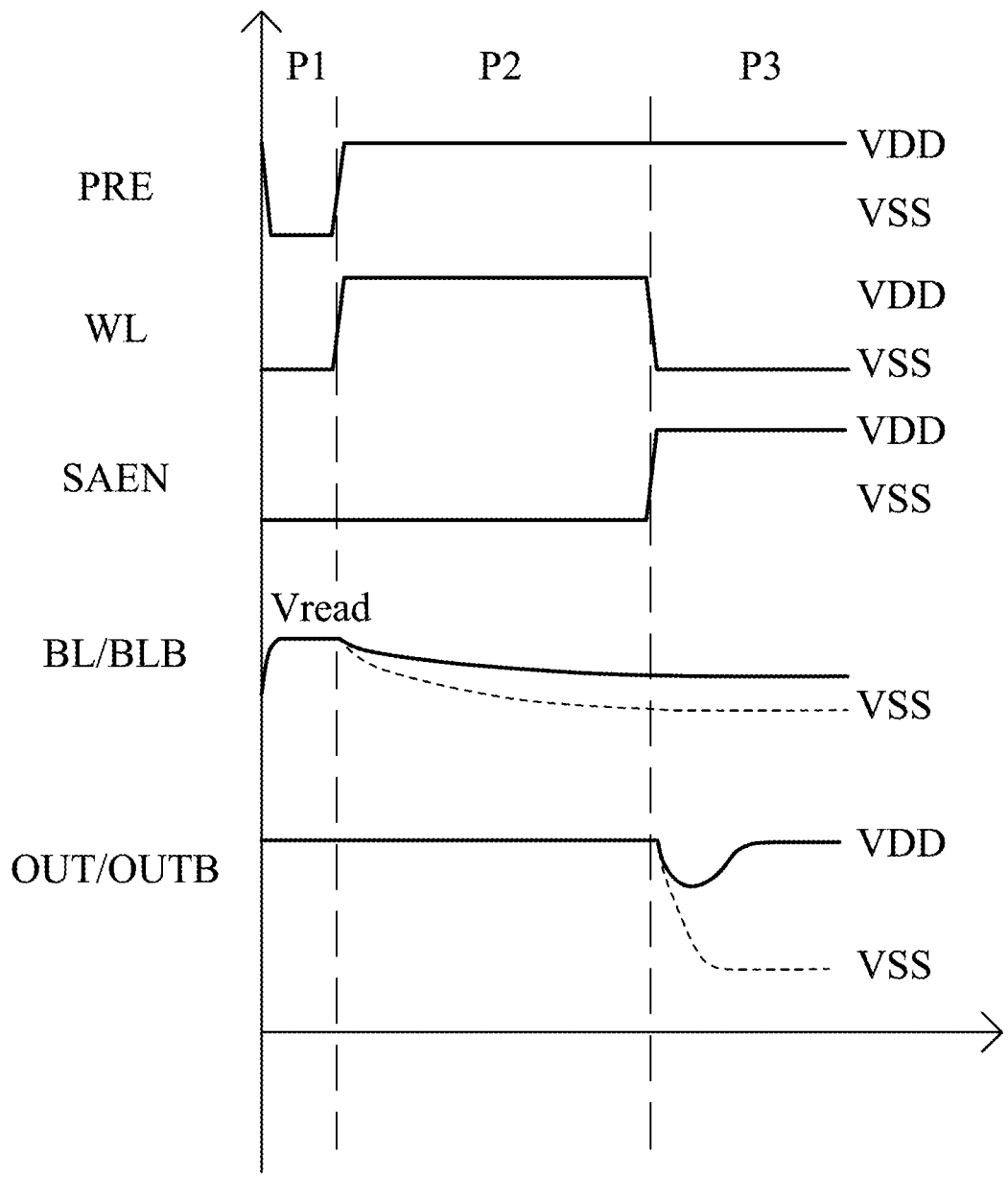
FIG. 1B is a waveform graph of controlling the sense amplifier of FIG. 1A.

See FIG. 1A and FIG. 1B, wherein FIG. 1A is a schematic diagram illustrating a sense amplifier 100, and FIG. 1B is a waveform graph of controlling the sense amplifier 100 of FIG. 1A. In a first phase P1, bit lines BL and BLB which are complementary to each other will be pre-charged to a reading voltage Vread in response to a pre-charge signal PRE, wherein the reading voltage Vread is lower than a predetermined voltage VDD but higher than a predetermined voltage VSS. In a second phase P2, a word line signal WL will be enabled, such that the bit lines BL and BLB will be discharged by the resistance of the memory cell connected to the sense amplifier 100. As long as the voltage difference between the bit lines BL and BLB is large enough, the sense amplifier enabling signal SAEN will be enabled in a third phase P3 for the sense amplifier 100 to sense the data of the correspondingly memory cell and output the amplified data via output nodes OUT and OUTB.

However, if the resistance of the memory cell is small, the discharging speeds of the bit lines BL and BLB may be similar to each other, such that the voltage difference between the bit lines BL and BLB may not be large enough. Under this situation, the performance of sensing and amplifying the data may be unacceptable.

In response thereto, the present disclosure proposes a set of pre-amplifiers that can be used to amplify the voltage difference between a first input terminal and a second input terminal (e.g., the terminals corresponding to the two complementary bit lines) of a sense amplifier, such that the sensing yield can be improved when, for example, the cell resistance is small or the load is light.

Figure 2:
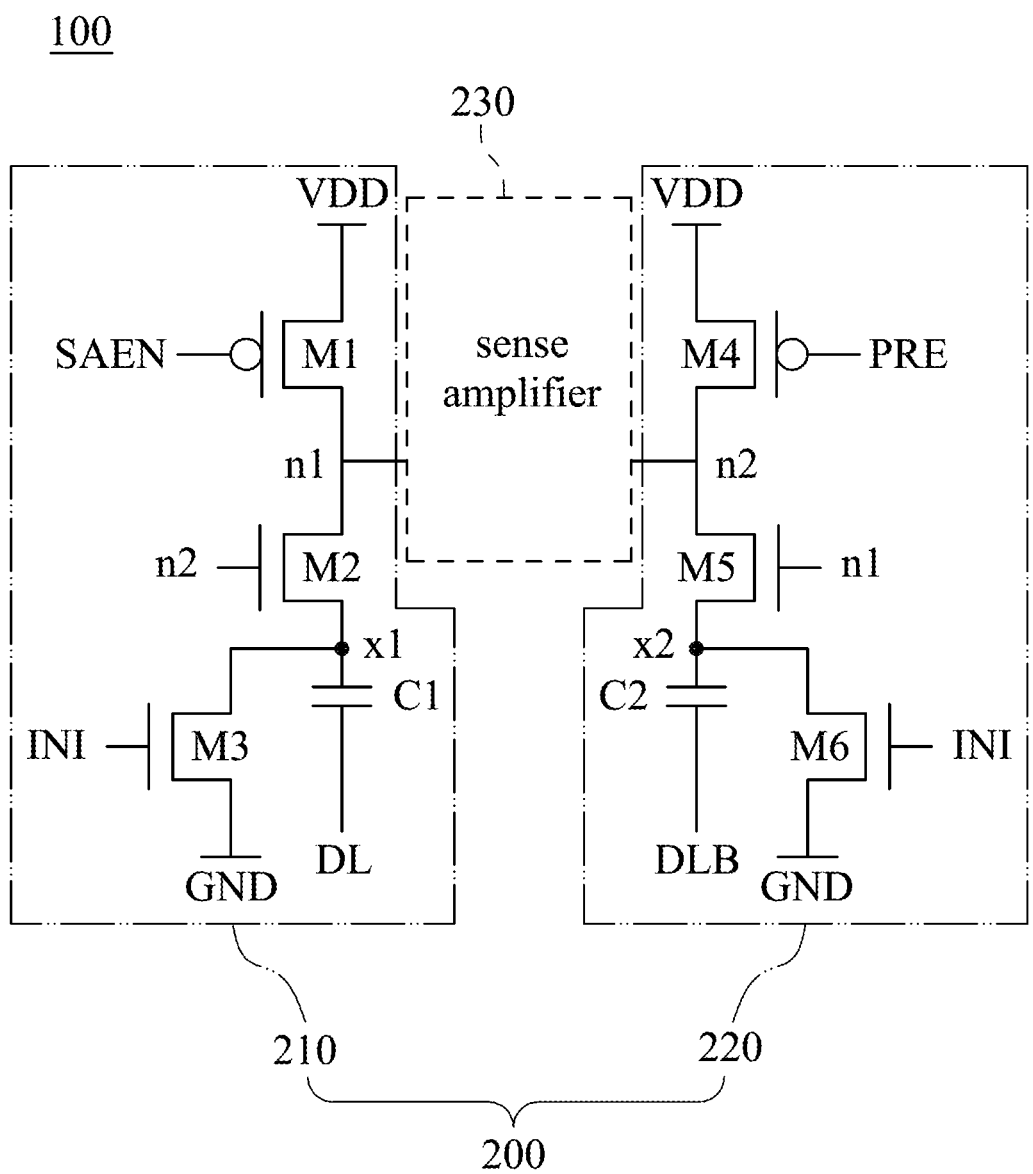
FIG. 2 is a schematic diagram illustrating a set of pre-amplifiers according to an exemplary embodiment of the present disclosure.

See FIG. 2, which is a schematic diagram illustrating a set 200 of pre-amplifiers according to an exemplary embodiment of the present disclosure. In the present embodiment, the set 200 of pre-amplifiers includes a first pre-amplifier 210 and a second pre-amplifier 220. The first pre-amplifier 210 is coupled to a first input terminal of a sense amplifier 230, and the second pre-amplifier 220 is coupled to a second input terminal of the sense amplifier 230. The sense amplifier 230 may be a conventional sense amplifier which regards its complementary bit lines as the first input terminal and the second input terminal, such as the sense amplifier 100 shown in FIG. 1A, but the present disclosure is not limited thereto.

As shown in FIG. 2, the first pre amplifier 210 includes a first switch M1, a second switch M2, a third switch M3, and a first capacitor C1. The first switch M1 has a first terminal, a second terminal, and a control terminal, wherein the first terminal of the first switch M1 is coupled to the predetermined voltage VDD, the second terminal of the first switch M1 (represented by a node n1) is coupled to the first input terminal of the sense amplifier 230, and the control terminal of the first switch M1 receives the pre-charge signal PRE. The second switch M2 has a first terminal, a second terminal, and a control terminal, wherein the first terminal of the second switch M2 is coupled to the second terminal of the first switch M1, and the control terminal of the second switch M2 (represented by a node n2) is coupled to the second input terminal of the sense amplifier 230.

The third switch M3 has a first terminal, a second terminal, and a control terminal, wherein the first terminal of the third switch M3 is coupled to the second terminal of the second switch M2, the second terminal of the third switch M3 is coupled to a ground GND, and a control terminal of the third switch M3 receives an initializing signal INI. The first capacitor C1 has a first terminal and a second terminal, wherein the first terminal of the first capacitor C1 (represented by a node x1) is coupled to the second terminal of the second switch M2.

In the present embodiment, the second terminal of the first capacitor C1 is coupled to a first data line DL of the sense amplifier 230, but the second terminal of the first capacitor C1 may be coupled with other elements, which will be discussed later.

On the other hand, the second pre-amplifier 220 includes a fourth switch M4, a fifth switch M5, a sixth switch M6, and a second capacitor C2. The fourth switch M4 has a first terminal, a second terminal, and a control terminal, wherein the first terminal of the fourth switch M4 is coupled to the predetermined voltage VDD, the second terminal of the fourth switch M4 (represented by the node n2) is coupled to the second input terminal of the sense amplifier 230, and the control terminal of the fourth switch M4 receives the pre-charge signal PRE. The fifth switch M5 has a first terminal, a second terminal, and a control terminal, wherein the first terminal of the fifth switch M5 is coupled to the second terminal of the fourth switch M4 and the control terminal of the fifth switch M5 (represented by the node n1) is coupled to the first input terminal of the sense amplifier 230.

The sixth switch M6 has a first terminal, a second terminal, and a control terminal, wherein the first terminal of the sixth switch M6 is coupled to the second terminal of the fifth switch M5, the second terminal of the sixth switch M6 is coupled to the ground GND, and a control terminal of the sixth switch M6 receives the initializing signal INI. The second capacitor C2 has a first terminal and a second terminal, wherein the first terminal of the second capacitor C2 (represented by a node x2) is coupled to the second terminal of the fifth switch M5.

Similar to the first capacitor C1, the second terminal of the second capacitor C2 is coupled to a second data line DLB of the sense amplifier 230, but the second terminal of the second capacitor C2 may be coupled with other elements, which will be discussed later.

As shown in FIG. 2, the second switch M2, the third switch M3, the fifth switch M5, and the sixth switch M6 are n-type transistors, while the first switch M1 and the fourth switch M4 are p-type transistors, but the present disclosure is not limited thereto.

See FIG. 3, which shows a flow chart of a method of operating the set 200 of pre-amplifiers according to an exemplary embodiment of the present disclosure. In step S310, the first pre-amplifier 210 and the second pre-amplifier 220 respectively performs a discharging operation to discharge the first input terminal (i.e., the node n1) and the second input terminal (i.e., the node n2) of the sense amplifier 230 after the first input terminal (i.e., the node n1) and the second input terminal (i.e., the node n2) of the sense amplifier 230 are charged to the predetermined voltage VDD.

Afterwards, in step S320, one of the first pre-amplifier 210 and the second pre-amplifier 220 amplifies a voltage difference between the first input terminal (i.e., the node n1) and the second input terminal (i.e., the node n2) of the sense amplifier 230 by terminating the discharging operation of another of the first pre-amplifier 210 and the second pre-amplifier 220.

In one embodiment, the one of the first pre-amplifier 210 and the second pre-amplifier 220 terminating the discharging operation of the other of the first pre-amplifier 210 and the second pre-amplifier 220 performs the discharging operation faster than the other of the first pre-amplifier 210 and the second pre-amplifier 220.

Specifically, since the capacitances of the first capacitor C1 and the second capacitor C2 may be different from each other, the first pre-amplifier 210 and the second pre-amplifier 220 will perform the discharging operation at different speeds. More particularly, if the capacitance of the first capacitor C1 is higher than the capacitance of the second capacitor C2, the speed of the first pre-amplifier 210 performing the discharging operation will be faster than the second pre-amplifier 220, and vice versa. That is, the voltage level of the first input terminal (i.e., the node n1) will drop faster than the voltage level of the second input terminal (i.e., the node n2) if the capacitance of the first capacitor C1 is higher than the capacitance of the second capacitor C2, otherwise the voltage level of the first input terminal (i.e., the node n1) will drop slower than the voltage level of the second input terminal (i.e., the node n2).

For example, the capacitance of the first capacitor C1 is assumed to be higher than the capacitance of the second capacitor C2. Therefore, the first pre-amplifier 210 may amplify the voltage difference between the first input terminal (i.e., the node n1) and the second input terminal (i.e., the node n2) of the sense amplifier 230 by terminating the discharging operation of the second pre-amplifier 220.

Specifically, since the node n1 will be discharged to the first data line DL faster than the node n2 being discharged to the second data line DLB under the assumption, the fifth switch M5 will be turned off when the voltage level of the node n1 reaches a specific voltage that is capable of turning off the fifth switch M5. Therefore, the node n2 will not be further discharged, such that the discharging operation of the second pre-amplifier 220 will be terminated. On the other hand, the voltage level of the node n1 will be continuously discharged to be lower and lower, such that the voltage difference between the nodes n1 and n2 can be amplified. As a result, the sensing yield of the sensing amplifier 230 can be improved when performing a sensing operation to sense the data of the memory cell based on the amplified voltage difference between the first input terminal (i.e., the node n1) and the second input terminal (i.e., the node n2).

Figure 4A:
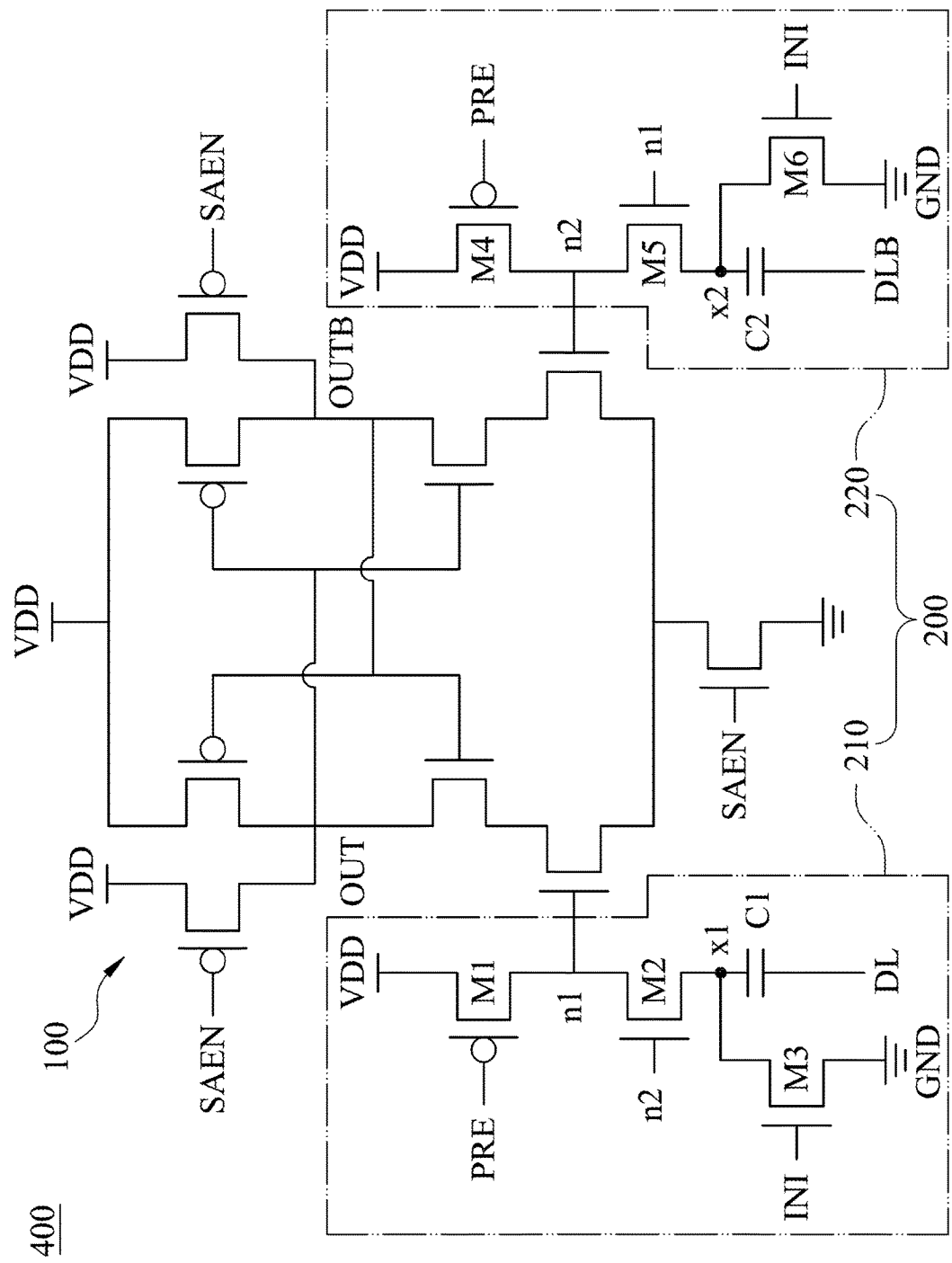
FIG. 4A is a schematic diagram of a sensing circuit for sensing data of a memory cell according to an exemplary embodiment of the present disclosure.
Figure 4B:
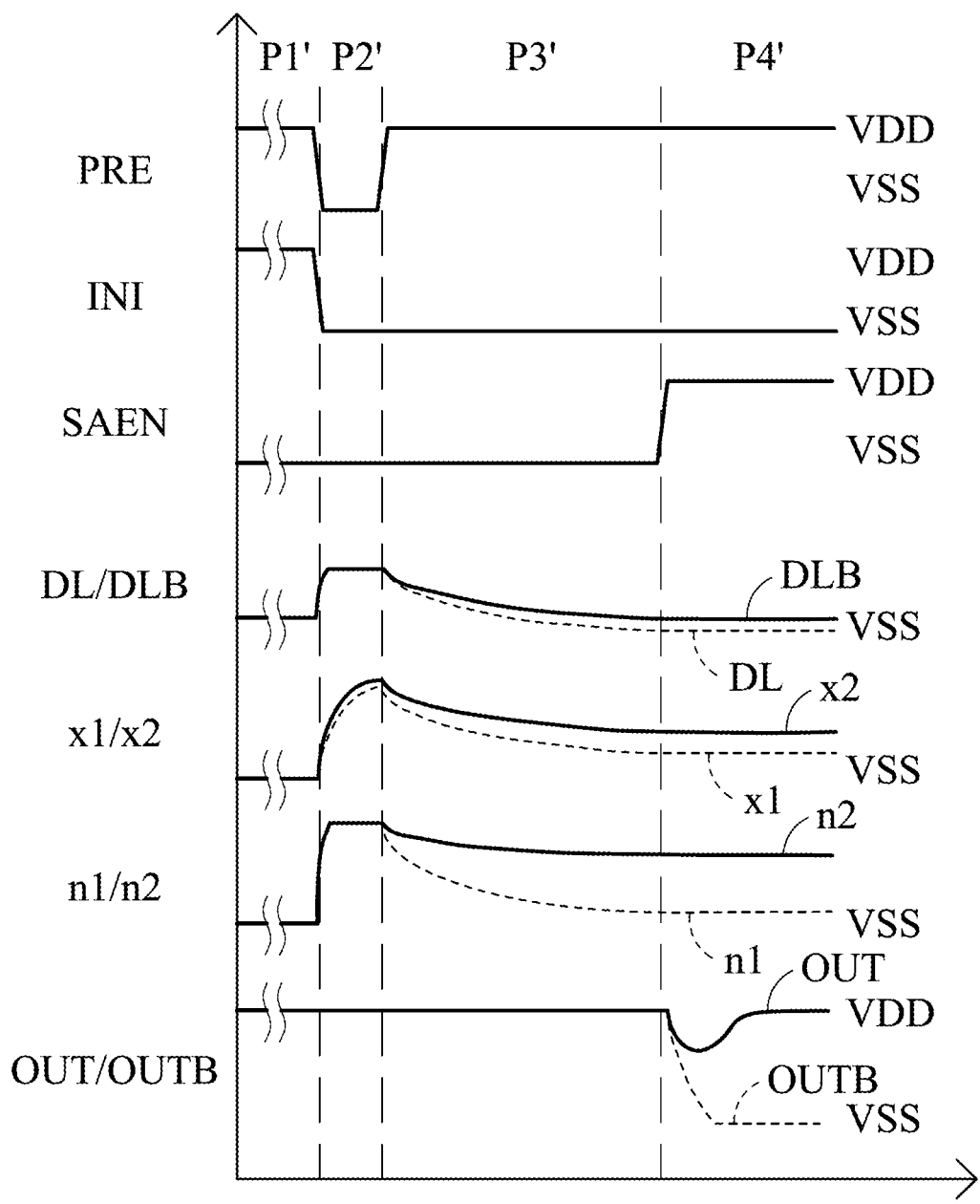
FIG. 4B is a waveform graph of controlling the sensing circuit of FIG. 4A.

See FIG. 4A and FIG. 4B for further discussion, wherein FIG. 4A is a schematic diagram of a sensing circuit 400 for sensing data of a memory cell according to an exemplary embodiment of the present disclosure, and FIG. 4B is a waveform graph of controlling the sensing circuit 400 of FIG. 4A. In the present embodiment, the sensing circuit 400 includes the sense amplifier 100, the first pre-amplifier 210, and the second pre-amplifier 220, wherein the first pre-amplifier 210 and the second pre-amplifier 220 are coupled to the first input terminal and the second input terminal of the sense amplifier 100 via the nodes n1 and n2, respectively. Specifically, the first input terminal and the second input terminal of the sense amplifier 100 may be the terminals that originally correspond to the two complementary bit lines BL and BLB, but the present disclosure is not limited thereto. The operations of each of the first pre-amplifier 210 and the second pre-amplifier 220 in phases P1', P2', P3', and P4' will be discussed in the following descriptions.

In the first phase P1', the voltage level at the second terminal of the second switch M2 (i.e., the node x1) and the second terminal of the fifth switch M5 (i.e., the node x2) are reset to zero in the first phase P1' after the pre-charge signal PRE turning off the first switch M1 and the fourth switch M4 and the initializing signal INI turning on the third switch M3 and the sixth switch M6.

In the second phase P2', the first input terminal (i.e., the node n1) and the second input terminal (i.e., the node n2) of the sense amplifier 100 is charged to the predetermined voltage VDD after the pre-charge signal PRE turning on the first switch M1 and the fourth switch M4 and the initializing signal INI turning off the third switch M3 and the sixth switch M6. Meanwhile, the first data line DL and the second data line DLB are charged to the reading voltage Vread. In this case, the voltage level of the node x1 becomes Vdd-$Vth_2$, and the voltage level of the node x2 becomes Vdd-$Vth_5$, wherein Vdd is the value of the predetermined voltage VDD, $Vth_2$ is the threshold voltage of the second switch M2, and $Vth_5$ is the threshold voltage of the second switch M5. That is, the threshold voltages of the second switch M2 and the fifth switch M5 will be respectively sampled at the nodes x1 and x2, and hence the manufacturing process variation of the first pre-amplifier 210 and the second pre-amplifier 220 can be suppressed during the sense amplifier 100 sensing and amplifying the data. Therefore, the sensing yield can be improved, and the first pre-amplifier 210 and the second pre-amplifier 220 may be suitable for advanced technology and high accuracy applications.

In the third phase P3' where the first pre-amplifier 210 and the second pre-amplifier 230 perform the discharging operation, the first input terminal and the second input terminal of the sense amplifier 100 are discharged after the pre-charge signal PRE turning off the first switch M1 and the fourth switch M4 and the initializing signal INI turning off the third switch M3 and the sixth switch M6.

In this case, the second input terminal (i.e., the node n2) of the sense amplifier 100 is discharged slower than the first input terminal of the sense amplifier 100, and hence the fifth switch M5 is turned off by the voltage level at the first input terminal (i.e., the node n1) of the sense amplifier 100 after the voltage level at the first input terminal (i.e., the node n1) reaches the specific voltage that is capable of turning off the fifth switch M5 to terminate the discharging operation of the second pre-amplifier 220. Afterwards, the voltage level of the node n1 will be continuously discharged to be lower and lower, such that the voltage difference between the nodes n1 and n2 can be amplified. As a result, the sensing yield of the sensing amplifier 100 can be improved when performing the sensing operation in the fourth phase P4' to sense the data of the memory cell based on the amplified voltage difference between the first input terminal (i.e., the node n1) and the second input terminal (i.e., the node n2).

In other embodiments, the first input terminal (La, the node n1) of the sense amplifier may be discharged slower than the second input terminal (i.e., the node n2) of the sense amplifier 100 if the capacitance of the first capacitor C1 is smaller than the capacitance of the second capacitor C2, and hence the second switch M2 is turned off by the voltage level at the second input terminal (i.e., the node n2) of the sense amplifier 100 after the voltage level at the second input terminal (i.e., the node n2) reaches the specific voltage that is capable of turning off the second switch M2 to terminate the discharging operation of the first pre-amplifier 210. Afterwards, the voltage level of the node n2 will be continuously discharged to be lower and lower, such that the voltage difference between the nodes n1 and n2 can be amplified. As a result, the sensing yield of the sensing amplifier 100 can be improved after performing the sensing operation to sense the data of the memory cell based on the amplified voltage difference between the first input terminal (i.e., the node n1) and the second input terminal (i.e., the node n2).

As mentioned in the above, the second terminal of the first capacitor C1 and the second terminal of the second capacitor C2 may be coupled with other elements in other embodiments.

Figure 5A:
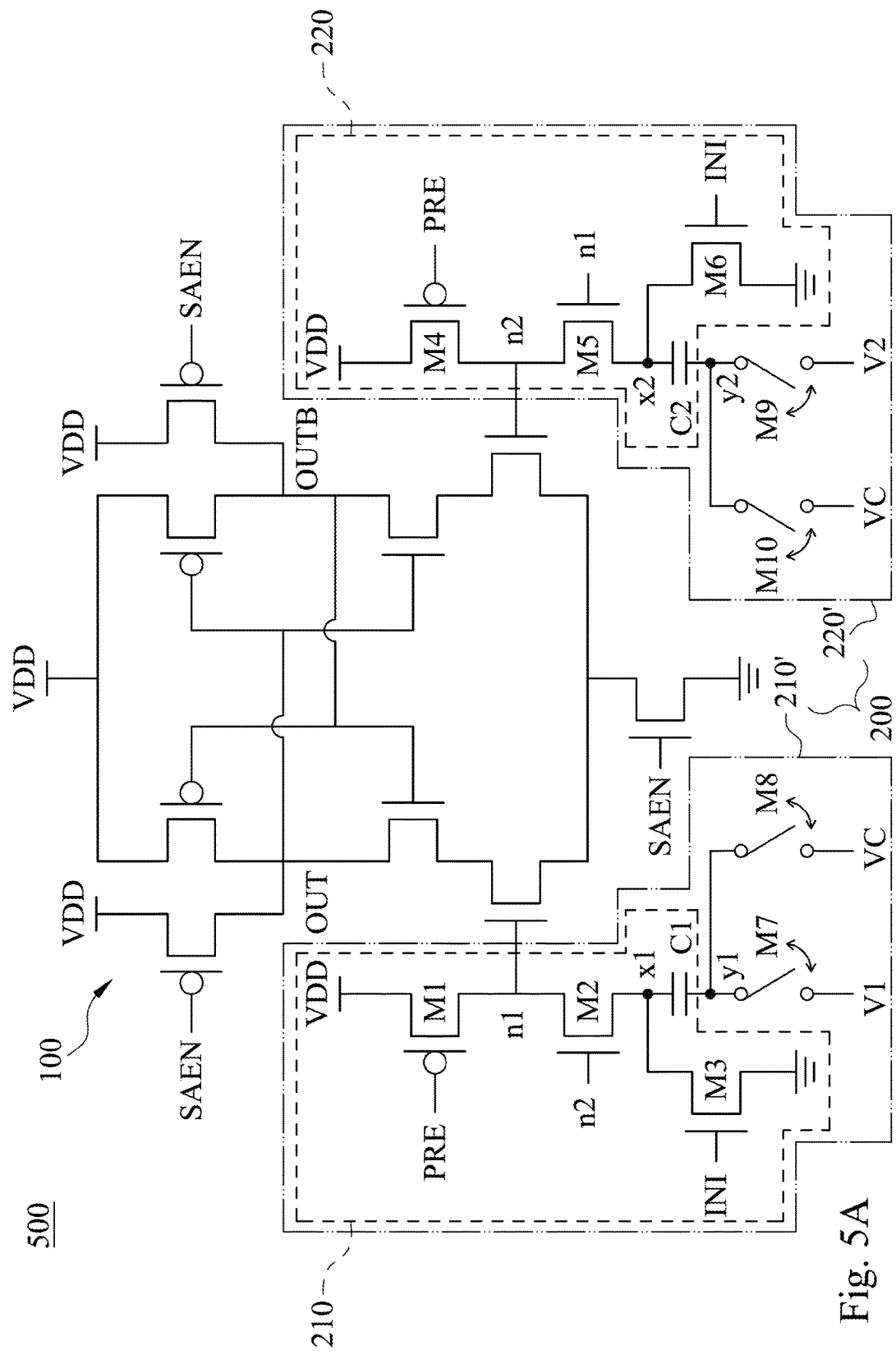
FIG. 5A is a schematic diagram of a sensing circuit for sensing data of a memory cell according to an exemplary embodiment of the present disclosure.
Figure 5B:
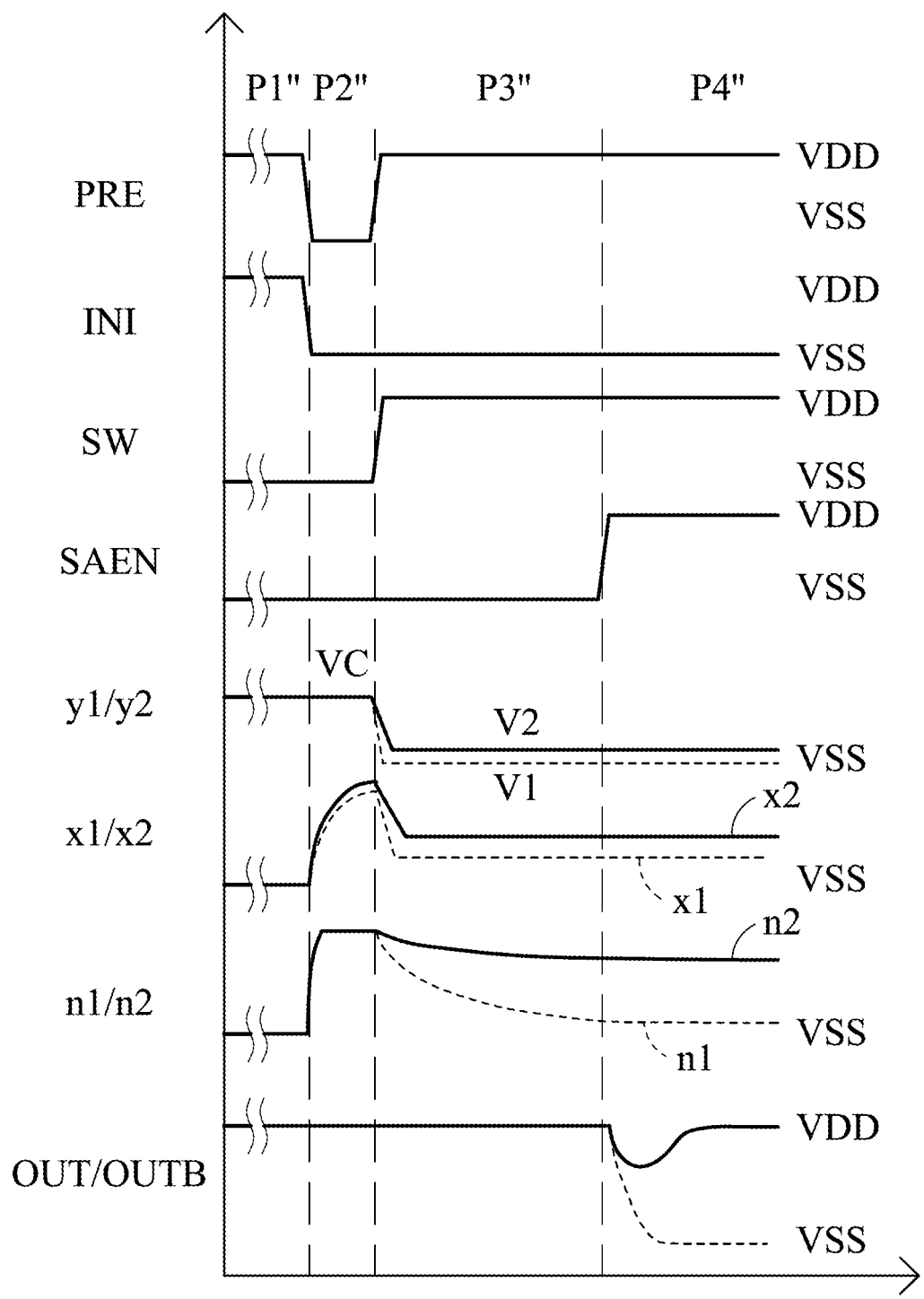
FIG. 5B is a waveform graph of controlling the sensing circuit of FIG. 5A.

See FIG. 5A and FIG. 5B, wherein FIG. 5A is a schematic diagram of a sensing circuit 500 for sensing data of a memory cell according to an exemplary embodiment of the present disclosure, and FIG. 5B is a waveform graph of controlling the sensing circuit 500 of FIG. 5A. In the present embodiment, the sensing circuit 500 includes the sense amplifier 100, a first pre-amplifier 210', and a second pre-amplifier 220'.

As shown in FIG. 5A, other than including all elements of the first pre-amplifier 210, the first pre-amplifier 210' further includes a seventh switch M7 and an eighth switch M8. The seventh switch M7 has a first terminal and a second terminal, wherein the first terminal of the seventh switch M7 is coupled to the second terminal of the first capacitor C1 (represented by a node y1), and the second terminal of the seventh switch M7 is coupled to a first voltage V1. The eighth switch M8 has a first terminal and a second terminal, wherein the first terminal of the eighth switch M8 is coupled to the second terminal of the first capacitor C1 (i.e., the node y1), and the second terminal of the eighth switch M8 is coupled to a reference voltage VC higher than the first voltage V1 but lower than the predetermined voltage VDD.

The seventh switch M7 may be controlled by a switch signal SW. Specifically, the seventh switch M7 may be turned off before the first input terminal (i.e., the node n1) of the sense amplifier 100 is charged to the predetermined voltage VDD and turned on when the first pre-amplifier 210' performs the discharging operation. On the other hand, the eighth switch M8 may be controlled by another switch signal complementary to the switch signal SW (not shown for brevity). That is, the eighth switch M8 is turned on before the first input terminal (i.e., the node n1) of the sense amplifier 100 is charged to the predetermined voltage VDD and turned off when the first pre-amplifier 210' performs the discharging operation.

As for the second pre-amplifier 220', other than including all elements of the second pre-amplifier 220, the second pre-amplifier 220' further includes a ninth switch M9 and a tenth switch M10. The ninth switch M9 has a first terminal and a second terminal, wherein the first terminal of the ninth switch M9 is coupled to the second terminal of the second capacitor C2 (represented by a node y2), and the second terminal of the ninth switch M9 is coupled to a second voltage V2. The tenth switch M10 has a first terminal and a second terminal, wherein the first terminal of the tenth switch M10 is coupled to the second terminal of the second capacitor C2 (i.e., the node y2), and the second terminal of the tenth switch M10 is coupled to the reference voltage VC higher than the first voltage V1 and the second voltage V2.

The ninth switch M9 may be controlled by the switch signal SW. Specifically, the ninth switch M9 may be turned off before the second input terminal (i.e., the node n2) of the sense amplifier 100 is charged to the predetermined voltage VDD, and the ninth switch M9 may be turned on when the second pre-amplifier 220' performs the discharging operation. On the other hand, the tenth switch M10 may be controlled by the other switch signal complementary to the switch signal SW wherein the tenth switch M10 is turned on before the second input terminal (i.e., the node n2) of the sense amplifier 100 is charged to the predetermined voltage VDD, and the tenth switch M10 is turned off when the second pre-amplifier 220' performs the discharging operation.

The operations of each of the first pre-amplifier 210' and the second pre-amplifier 220' in phases P1", P2", P3", and P4" will be discussed in the following descriptions.

In the first phase P1", the voltage level at the second terminal of the second switch M2 (i.e., the node x1) and the second terminal of the fifth switch M5 (i.e., the node x2) are reset to zero in the first phase P1' after the pre-charge signal PRE turning off the first switch M1 and the fourth switch M4 and the initializing signal INI turning on the third switch M3 and the sixth switch M6. Meanwhile, the eighth switch M8 and the tenth switch M10 may be turned on to feed the reference voltage VC to the second terminal of the first capacitor C1 (i.e., the node y1) and the second terminal of the second capacitor C2 (i.e., the node y2), while the seventh switch M7 and the ninth switch M9 are turned off by the switch signal SW.

In the second phase P2", the first input terminal (i.e., the node n1) and the second input terminal (i.e., the node n2) of the sense amplifier 100 is charged to the predetermined voltage VDD after the pre-charge signal PRE turning on the first switch M1 and the fourth switch M4 and the initializing signal INI turning off the third switch M3 and the sixth switch M6. In this case, the voltage level of the node x1 becomes Vdd-Vth$_2$, and the voltage level of the node x2 becomes Vdd-Vth$_5$, wherein Vdd is the value of the predetermined voltage VDD, Vth$_2$ is the threshold voltage of the second switch M2, and Vth$_5$ is the threshold voltage of the second switch M5. That is, the threshold voltages of the second switch M2 and the fifth switch M5 will be respectively sampled at the nodes x1 and x2, and hence the manufacturing process variation of the first pre-amplifier 210' and the second pre-amplifier 220' can be suppressed during the sense amplifier 100 sensing and amplifying the data. Therefore, the sensing yield can be improved.

In the third phase P3" where the first pre-amplifier 210' and the second pre-amplifier 230' perform the discharging operation, the first input terminal and the second input terminal of the sense amplifier 100 are discharged after the pre-charge signal PRE turning off the first switch M1 and the fourth switch M4 and the initializing signal INI turning off the third switch M3 and the sixth switch M6. Meanwhile, the seventh switch M7 and the ninth switch M9 may be turned on by the switch signal SW to respectively feed the first voltage V1 and the second voltage V2 to the second terminal of the first capacitor C1 (i.e., the node y1) and the second terminal of the second capacitor C2 (i.e., the node y2), while the eighth switch M8 and the tenth switch M10 are turned off.

In this case, the second input terminal (i.e., the node n2) of the sense amplifier 100 is discharged slower than the first input terminal of the sense amplifier 100, and hence the fifth switch M5 is turned off by the voltage level at the first input terminal (i.e., the node n1) of the sense amplifier 100 after the voltage level at the first input terminal (i.e., the node n1) reaches the specific voltage that is capable of turning off the fifth switch M5 to terminate the discharging operation of the second pre-amplifier 220'. Afterwards, the voltage level of the node n1 will be continuously discharged to be lower and lower, such that the voltage difference between the nodes n1 and n2 can be amplified. As a result, the sensing yield of the sensing amplifier 100 can be improved when performing the sensing operation in the fourth phase P4" to sense the data of the memory cell based on the amplified voltage difference between the first input terminal (i.e., the node n1) and the second input terminal (i.e., the node n2).

In other embodiments, the first input terminal (i.e., the node n1) of the sense amplifier may be discharged slower than the second input terminal (i.e., the node n2) of the sense amplifier 100 if the capacitance of the first capacitor C1 is smaller than the capacitance of the second capacitor C2, and hence the second switch M2 is turned off by the voltage level at the second input terminal (i.e., the node n2) of the sense amplifier 100 after the voltage level at the second input terminal (i.e., the node n2) reaches the specific voltage that is capable of turning off the second switch M2 to terminate the discharging operation of the first pre-amplifier 210'.

Afterwards, the voltage level of the node n2 will be continuously discharged to be lower and lower, such that the voltage difference between the nodes n1 and n2 can be amplified. As a result, the sensing yield of the sensing amplifier 100 can be improved when performing the sensing operation to sense the data of the memory cell based on the amplified voltage difference between the first input terminal (i.e., the node n1) and the second input terminal (i.e., the node n2).

To sum up, the present disclosure proposes a sensing circuit, a set of pre-amplifiers, and an operating method of the set of the pre-amplifiers, wherein the one of the pre-amplifiers which is discharged faster can terminate the discharging operation of the other of the pre-amplifiers, such that the one of the pre-amplifiers may be continuously discharged to amplify the voltage difference between the input terminals of the sense amplifier. Therefore, when the sensing amplifier performs a sensing operation to sense the data of the memory cell based on the amplified voltage difference, the sensing yield can be improved and the sensing time can be reduced.

Further, since the threshold voltages of switches may be sampled, the manufacturing process variation can be suppressed, such that the present disclosure may be suitable for advanced technology and high accuracy applications.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A set of pre-amplifiers of a sense amplifier, comprising:
   a first pre-amplifier, coupled to a first input terminal of the sense amplifier; and
   a second pre-amplifier, coupled to a second input terminal of the sense amplifier;
   wherein the first pre-amplifier and the second pre-amplifier respectively performs a discharging operation to discharge the first input terminal and the second input terminal of the sense amplifier after the first input terminal and the second input terminal of the sense amplifier are charged to a predetermined voltage; and
   one of the first pre-amplifier and the second pre-amplifier amplifies a voltage difference between the first input terminal and the second input terminal of the sense amplifier by terminating the discharging operation of another of the first pre-amplifier and the second pre-amplifier;
   wherein the first pre-amplifier comprises:
      a first switch, having a first terminal, a second terminal, and a control terminal, wherein the first terminal of the first switch is coupled to the predetermined voltage, the second terminal of the first switch is coupled to the first input terminal of the sense amplifier, and the control terminal of the first switch receives a pre-charge signal;
      a second switch, having a first terminal, a second terminal, and a control terminal, wherein the first terminal of the second switch is coupled to the second terminal of the first switch and the control terminal of the second switch is coupled to the second input terminal of the sense amplifier;
      a third switch, having a first terminal, a second terminal, and a control terminal, wherein the first terminal of the third switch is coupled to the second terminal of the second switch, the second terminal of the third switch is coupled to a ground, and a control terminal of the third switch receives an initializing signal; and
      a first capacitor, having a first terminal and a second terminal, wherein the first terminal of the first capacitor is coupled to the second terminal of the second switch.

2. The set of pre-amplifiers of the sense amplifier of claim 1, wherein the first pre-amplifier and the second pre-amplifier perform the discharging operation at different speeds, and the one of the first pre-amplifier and the second pre-amplifier terminating the discharging operation of the other of the first pre-amplifier and the second pre-amplifier performs the discharging operation faster than the other of the first pre-amplifier and the second pre-amplifier.

3. The set of pre-amplifiers of the sense amplifier of claim 1, wherein the second pre-amplifier comprises:
   a fourth switch, having a first terminal, a second terminal, and a control terminal, wherein the first terminal of the fourth switch is coupled to the predetermined voltage, the second terminal of the fourth switch is coupled to the second input terminal of the sense amplifier, and the control terminal of the fourth switch receives the pre-charge signal;
   a fifth switch, having a first terminal, a second terminal, and a control terminal, wherein the first terminal of the fifth switch is coupled to the second terminal of the fourth switch and the control terminal of the fifth switch is coupled to the first input terminal of the sense amplifier;
   a sixth switch, having a first terminal, a second terminal, and a control terminal, wherein the first terminal of the sixth switch is coupled to the second terminal of the fifth switch, the second terminal of the sixth switch is coupled to the ground, and a control terminal of the sixth switch receives the initializing signal; and
   a second capacitor, having a first terminal and a second terminal, wherein the first terminal of the second capacitor is coupled to the second terminal of the fifth switch.

4. The set of pre-amplifiers of the sense amplifier of claim 3, wherein the second terminal of the first capacitor is coupled to a first data line of the sense amplifier, the second terminal of the second capacitor is coupled to a second data line of the sense amplifier, and the first pre-amplifier and the second pre-amplifier perform the discharging operation by respectively discharging to the first data line and the second data line.

5. The set of pre-amplifiers of the sense amplifier of claim 3, wherein the first pre-amplifier further comprises:
   a seventh switch, having a first terminal and a second terminal, wherein the first terminal of the seventh switch is coupled to the second terminal of the first capacitor, and the second terminal of the seventh switch is coupled to a first voltage; and
   an eighth switch, having a first terminal and a second terminal, wherein the first terminal of the eighth switch is coupled to the second terminal of the first capacitor, and the second terminal of the eighth switch is coupled to a reference voltage higher than the first voltage but lower than the predetermined voltage;

wherein the seventh switch is turned off before the first input terminal of the sense amplifier is charged to the predetermined voltage and turned on when the first pre-amplifier performs the discharging operation;

wherein the eighth switch is turned on before the first input terminal of the sense amplifier is charged to the predetermined voltage and turned off when the first pre-amplifier performs the discharging operation.

6. The set of pre-amplifiers of the sense amplifier of claim 5, wherein the second pre-amplifier further comprises:

a ninth switch, having a first terminal and a second terminal, wherein the first terminal of the ninth switch is coupled to the second terminal of the second capacitor, and the second terminal of the ninth switch is coupled to a second voltage; and a tenth switch, having a first terminal and a second terminal, wherein the first terminal of the tenth switch is coupled to the second terminal of the second capacitor, and the second terminal of the tenth switch is coupled to the reference voltage higher than the first voltage and the second voltage;

wherein the ninth switch is turned off before the second input terminal of the sense amplifier is charged to the predetermined voltage and turned on when the second pre-amplifier performs the discharging operation;

wherein the tenth switch is turned on before the second input terminal of the sense amplifier is charged to the predetermined voltage and turned off when the second pre-amplifier performs the discharging operation.

7. The set of pre-amplifiers of the sense amplifier of claim 3, wherein a voltage level at the second terminal of the fifth switch is reset to zero in a first phase after the pre-charge signal turning off the fourth switch and the initializing signal turning on the sixth switch;

wherein the second input terminal of the sense amplifier is charged to the predetermined voltage in a second phase after the pre-charge signal turning on the fourth switch and the initializing signal turning off the sixth switch; and wherein the second input terminal of the sense amplifier is discharged in a third phase where the first pre-amplifier and the second pre-amplifier perform the discharging operation after the pre-charge signal turning off the fourth switch and the initializing signal turning off the sixth switch;

wherein when the second input terminal of the sense amplifier is discharged slower than the first input terminal of the sense amplifier, the fifth switch is turned off by a voltage level at the first input terminal of the sense amplifier after the voltage level at the first input terminal reaches a specific voltage that is capable of turning off the fifth switch to terminate the discharging operation of the second pre-amplifier.

8. The set of pre-amplifiers of the sense amplifier of claim 1, wherein a voltage level at the second terminal of the second switch is reset to zero in a first phase after the pre-charge signal turning off the first switch and the initializing signal turning on the third switch;

wherein the first input terminal of the sense amplifier is charged to the predetermined voltage in a second phase after the pre-charge signal turning on the first switch and the initializing signal turning off the third switch; and wherein the first input terminal of the sense amplifier is discharged in a third phase where the first pre-amplifier and the second pre-amplifier perform the discharging operation after the pre-charge signal turning off the first switch and the initializing signal turning off the third switch;

wherein when the first input terminal of the sense amplifier is discharged slower than the second input terminal of the sense amplifier, the second switch is turned off by a voltage level at the second input terminal of the sense amplifier after the voltage level at the second input terminal reaches a specific voltage that is capable of turning off the second switch to terminate the discharging operation of the first pre-amplifier.

9. A sensing circuit for sensing data of a memory cell, comprising:

a sense amplifier, having a first input terminal and a second input terminal;

a set of pre-amplifiers of a sense amplifier, comprising:

a first pre-amplifier, coupled to a first input terminal of the sense amplifier; and a second pre-amplifier, coupled to a second input terminal of the sense amplifier;

wherein the first pre-amplifier and the second pre-amplifier respectively performs a discharging operation to discharge the first input terminal and the second input terminal of the sense amplifier after the first input terminal and the second input terminal of the sense amplifier are charged to a predetermined voltage;

one of the first pre-amplifier and the second pre-amplifier amplifies a voltage difference between the first input terminal and the second input terminal of the sense amplifier by terminating the discharging operation of another of the first pre-amplifier and the second pre-amplifier; and the sense amplifier performs a sensing operation to sense the data of the memory cell based on the amplified voltage difference between the first input terminal and the second input terminal.

10. An operating method of a set of pre-amplifiers having a first pre-amplifier and a second pre-amplifier respectively coupled to a first input terminal and a second input terminal of a sense amplifier, wherein the operating method comprises:

respectively performing, by the first pre-amplifier and the second pre-amplifier, a discharging operation to discharge the first input terminal and the second input terminal of the sense amplifier after the first input terminal and the second input terminal of the sense amplifier are charged to a predetermined voltage; and amplifying, by one of the first pre-amplifier and the second pre-amplifier, a voltage difference between the first input terminal and the second input terminal of the sense amplifier by terminating the discharging operation of another of the first pre-amplifier and the second pre-amplifier;

wherein the first pre-amplifier comprises:

a first switch, having a first terminal, a second terminal, and a control terminal, wherein the first terminal of the first switch is coupled to the predetermined voltage, the second terminal of the first switch is coupled to the first input terminal of the sense amplifier, and the control terminal of the first switch receives a pre-charge signal;

a second switch, having a first terminal, a second terminal, and a control terminal, wherein the first terminal of the second switch is coupled to the second terminal of the first switch and the control terminal of the second switch is coupled to the second input terminal of the sense amplifier;

a third switch, having a first terminal, a second terminal, and a control terminal, wherein the first terminal of the third switch is coupled to the second terminal of the second switch, the second terminal of the third switch is coupled to a ground, and a control terminal of the third switch receives an initializing signal; and a first capacitor, having a first terminal and a second terminal, wherein the first terminal of the first capacitor is coupled to the second terminal of the second switch.

11. The operating method of claim 10, wherein the first pre-amplifier and the second pre-amplifier perform the discharging operation at different speeds, and the one of the first pre-amplifier and the second pre-amplifier terminating the discharging operation of the other of the first pre-amplifier and the second pre-amplifier performs the discharging operation faster than the other of the first pre-amplifier and the second pre-amplifier.

\* \* \* \* \*